(12) United States Patent
Eidukonis et al.

(10) Patent No.: US 12,247,283 B2
(45) Date of Patent: Mar. 11, 2025

(54) METHOD AND APPARATUS FOR CONTROLLED ION IMPLANTATION

(71) Applicant: Applied Materials, Inc., Santa Clara, CA (US)

(72) Inventors: Alexander K. Eidukonis, Amesbury, MA (US); Hans-Joachim L. Gossmann, Summit, NJ (US); Dennis Rodier, Francestown, NH (US); Stanislav S. Todorov, Topsfield, MA (US); Richard White, Newmarket, NH (US); Wei Zhao, Lexington, MA (US); Wei Zou, Lexington, MA (US); Supakit Charnvanichborikarn, Gloucester, MA (US)

(73) Assignee: Applied Materials, Inc., Santa Clara, CA (US)

( * ) Notice: Subject to any disclaimer, the term of this patent is extended or adjusted under 35 U.S.C. 154(b) by 495 days.

(21) Appl. No.: 17/560,529

(22) Filed: Dec. 23, 2021

(65) Prior Publication Data

US 2023/0016122 A1    Jan. 19, 2023

Related U.S. Application Data

(60) Provisional application No. 63/220,273, filed on Jul. 9, 2021.

(51) Int. Cl.
*H01L 29/06* (2006.01)
*C23C 14/48* (2006.01)
(Continued)

(52) U.S. Cl.
CPC .............. *C23C 14/54* (2013.01); *C23C 14/48* (2013.01); *H01J 37/304* (2013.01); *H01J 37/3171* (2013.01); *H01L 29/0634* (2013.01)

(58) Field of Classification Search
CPC ........ C23C 14/48; C23C 14/54; H01J 37/304; H01J 37/3171; H01L 21/26513; H01L 29/0634

See application file for complete search history.

(56) References Cited

U.S. PATENT DOCUMENTS

| 6,482,660 B2 | 11/2002 | Conchieri et al. |
| 10,515,780 B1 | 12/2019 | Nouri |

(Continued)

FOREIGN PATENT DOCUMENTS

| KR | 10-2004-0052411 A | 6/2004 |
| TW | 200739821 A | 10/2007 |
| WO | 2009/042462 A2 | 4/2009 |

OTHER PUBLICATIONS

International Search Report and Written Opinion dated Oct. 26, 2022, for the International Patent Application No. PCT/US2022/034664, filed on Jun. 23, 2022, 8 pages.

*Primary Examiner* — Jaehwan Oh
(74) *Attorney, Agent, or Firm* — KDW FIRM PLLC (57) ABSTRACT

A method of operating a beamline ion implanter may include performing, in an ion implanter, a first implant procedure to implant a dopant of a first polarity into a given semiconductor substrate, and generating an estimated implant dose of the dopant of the first polarity based upon a set of filtered information, generated by the first implant procedure. The method may also include calculating an actual implant dose of the dopant of the first polarity using a predictive model based upon the estimated implant dose, and performing, in the ion implanter, an adjusted second implant procedure to implant a dopant of a second polarity into a select semiconductor substrate, based upon the actual implant dose.

17 Claims, 7 Drawing Sheets

(51) Int. Cl.
　　　*C23C 14/54*　　　(2006.01)
　　　*H01J 37/304*　　(2006.01)
　　　*H01J 37/317*　　(2006.01)

(56) References Cited

U.S. PATENT DOCUMENTS

| | | |
|---|---|---|
| 2003/0162341 A1 | 8/2003 | Raebiger |
| 2017/0243747 A1* | 8/2017 | Brugger .................. H01L 22/20 |
| 2018/0068828 A1* | 3/2018 | Halling ................ H01J 37/3171 |
| 2020/0251360 A1* | 8/2020 | Liao ..................... G05B 23/024 |

* cited by examiner

METHOD AND APPARATUS FOR CONTROLLED ION IMPLANTATION

RELATED APPLICATIONS

This application claims priority to U.S. provisional patent application Ser. No. 63/220,273, filed on Jul. 9, 2021, entitled METHOD AND APPARATUS FOR CONTROLLED ION IMPLANTATION, and incorporated by reference in its entirety herein.

FIELD OF THE DISCLOSURE

The disclosure relates generally to apparatus and techniques for implanting substrates, and more particularly, to improved implantation dose control.

BACKGROUND OF THE DISCLOSURE

Ion implantation is a process of introducing dopants or impurities into a substrate via bombardment. In semiconductor manufacturing, the dopants are introduced to alter electrical, optical, or mechanical properties.

Ion implantation systems may comprise an ion source and a series of beam-line components. The ion source may comprise a chamber where ions are generated. The ion source may also comprise a power source and an extraction electrode assembly disposed near the chamber. The beam-line components, may include, for example, a mass analyzer, a first acceleration or deceleration stage, a collimator, and a second acceleration or deceleration stage. Much like a series of optical lenses for manipulating a light beam, the beam-line components can filter, focus, and manipulate ions or ion beam having particular species, shape, energy, and/or other qualities. The ion beam passes through the beam-line components and may be directed toward a substrate mounted on a platen or clamp. The substrate may be moved in one or more dimensions (e.g., translate, rotate, and tilt) by an apparatus, sometimes referred to as a roplat.

Ion implantation has long been used to introduce dopants into semiconductor devices, including for formation of wells, source/drain regions, channels, and other portions of a device structure. As semiconductor devices scale to smaller dimensions and include increasingly complex device structures, fabrication of the current state-of-the-art devices requires increasingly tight process tolerances. In this regard, one of the main concerns during operation of a beam-line ion implanter, is the ability to maintain operating conditions that generate a high device yield on substrates, such as semiconductor wafers, being implanted.

In some processing schemes, such as for formation of power semiconductor devices, including superjunction devices, relatively small changes in relative ratio of p-type dopants to n-type dopants may induce relatively large changes in device properties. For example, changes in relative dopant concentration on the order of one half to one percent, 3 sigma (within 3 standard deviations), may lead to unacceptably large variation in properties such as breakdown voltage. Notably, present day implant technology may not afford control of dopant concentration to this level, either on a within-wafer basis, a wafer-to-wafer basis, or lot-to-lot basis.

With respect to these and other considerations, the present disclosure is provided.

BRIEF SUMMARY

In one embodiment, a method of operating a beamline ion implanter is provided. The method may include performing, in an ion implanter, a first implant procedure to implant a dopant of a first polarity into a given semiconductor substrate, and generating an estimated implant dose of the dopant of the first polarity based upon a set of filtered information, generated by the first implant procedure. The method may also include calculating an actual implant dose of the dopant of the first polarity using a predictive model based upon the estimated implant dose, and performing, in the ion implanter, an adjusted second implant procedure to implant a dopant of a second polarity into a select semiconductor substrate, based upon the actual implant dose.

In a further embodiment, a non-transitory computer-readable storage medium, is provided that includes instructions that when executed by a computer, cause the computer to generate a set of filtered data, based upon on-board implant data, derived from a first implant procedure of a dopant of a first polarity, performed in an ion implanter on a given semiconductor substrate. The instructions may further cause the computer to generate an estimated implant dose of the dopant of the first polarity based upon the set of filtered data, calculate an actual implant dose of the dopant of the first polarity based upon the estimated implant dose. The instructions may further cause the computer to send instructions to implement an adjusted second implant procedure to implant a dopant of a second polarity into a select semiconductor substrate, based upon the actual implant dose.

In another embodiment, an ion implanter is provided that may include an ion source to generate an ion beam, a set of beamline components to implant the ion beam into a given substrate, and a current monitor to measure an implant dose of the ion beam in the given substrate. The ion implanter may include a feedforward controller, including a memory and a processor. The feedforward controller may include a dose-matching routine operable on the processor to generate a set of filtered data, based upon on-board implant data, derived from a first implant procedure for a dopant of a first polarity, where the first implant procedure is performed in the ion implanter on the given substrate. The dose-matching routine may be operable on the processor to generate an estimated implant dose of the dopant of the first polarity based upon the set of filtered data, and calculate an actual implant dose of the dopant of the first polarity based upon the estimated implant dose. The dose-matching routine may be operable on the processor to send instructions to implement an adjusted second implant procedure to implant a dopant of a second polarity into a select semiconductor substrate, based upon the actual implant dose.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

A system and method in accordance with the present disclosure will now be described more fully hereinafter with reference to the accompanying drawings, where embodiments of the system and method are shown. The system and method may be embodied in many different forms and are not be construed as being limited to the embodiments set forth herein. Instead, these embodiments are provided so this disclosure will be thorough and complete, and will fully convey the scope of the system and method to those skilled in the art.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Provided herein are approaches for improved ion implantation control, and in particular for improved ion dose matching for fabrication of semiconductor devices.

Figure 1:
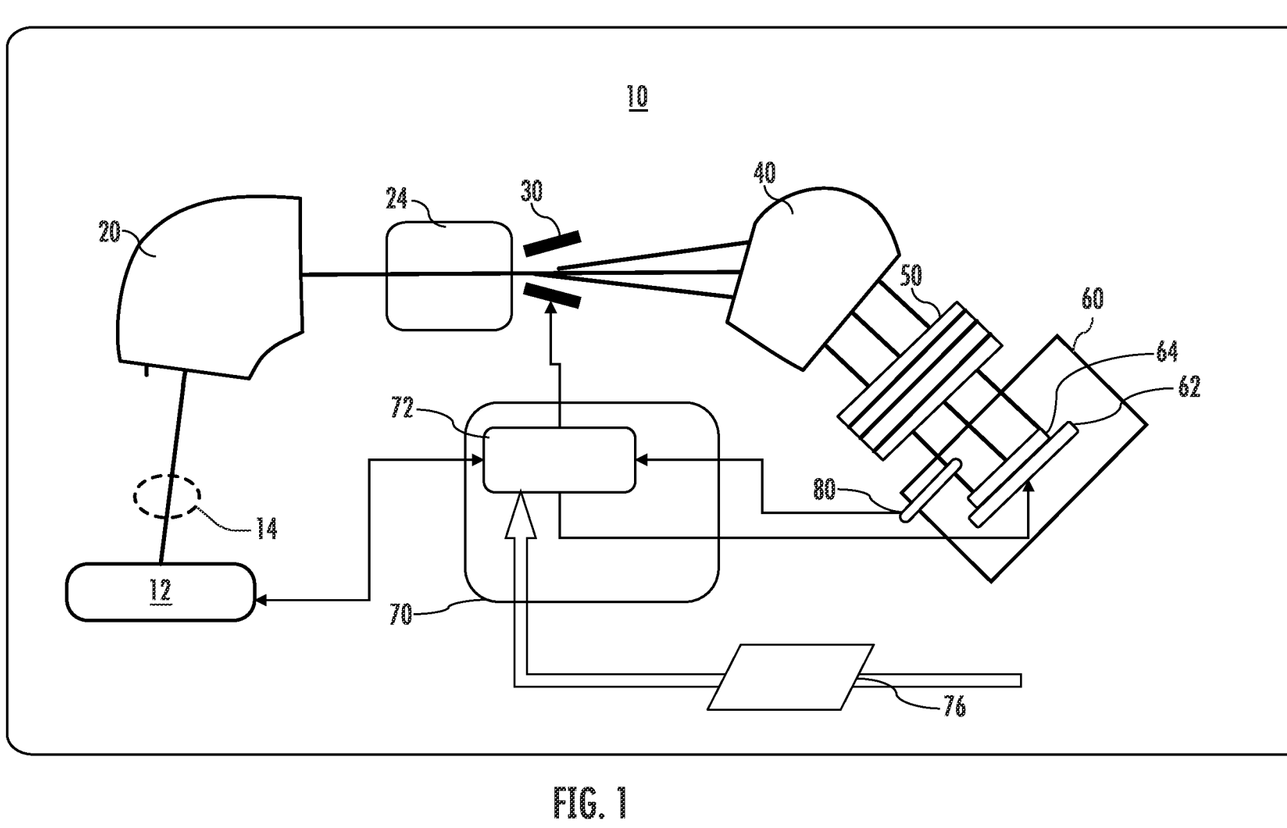
FIG. 1 shows an exemplary embodiment demonstrating an ion implantation system, according to embodiments of the disclosure.

Referring now to FIG. 1, an exemplary embodiment demonstrating a system 10 is shown, where the system 10 may be used as a beam-line ion implanter, or "ion implanter," for ion implantation in accordance with the present disclosure. Generally, a beamline ion implanter according to the present embodiments will include an ion source and a set of components to conduct the ion beam along a beam-line to a process chamber. In the example of FIG. 1, the system 10 includes, among other components, an ion source 12 for producing an ion beam 14, such as a ribbon beam or a spot beam, and a series of beam-line components. The ion source 12 may comprise a chamber for receiving a flow of gas (not shown) to generate ions. The ion source 12 may also comprise a power source and an extraction electrode assembly disposed near the chamber. In some non-limiting embodiments, the beam-line components may include, for example, a mass analyzer 20, a mass-resolving slit (MRS) chamber 24, a scanner 30, and a collimator 40, disposed upstream of an energy filter 50, which filter may provide deceleration and/or acceleration or the ion beam 14.

In exemplary embodiments, the components of the beam-line may filter, focus, and manipulate ions or the ion beam 14 to have a species, shape, energy, and/or other qualities. The ion beam 14 passing through the beam-line may be directed toward a substrate 64 mounted on a platen 62 or clamp within a process chamber 60, or endstation. The substrate 64 may be moved in one or more dimensions (e.g., translate, rotate, and tilt).

In operation, the system 10 may operate to implant a series of substrates, such as semiconductor wafers. The substrate 64 may be one of a series of substrates that are loaded in serial fashion for implantation, as in known ion implanters. In a high throughput mode of operation, the system 10 may operate to implant thousands or tens of thousands of substrates between intervals of scheduled downtime.

As shown in FIG. 1, the system 10 may include a control system 70, to control operation of various components along the beamline of the ion implanter, including ion source 12, scanner 30, and substrate stage, including platen 62, according to some embodiments. In particular, the control system 70 may include a feedforward controller 72, where the operation of the feedforward controller 72 will be detailed below. In brief, the feedforward controller 72 may be coupled to receive input including on-board data collected in the beamline components of the system 10, as well as in-line data, collected from other fabrication tools or measurement tools of a fabricator including the system 10. During ion implantation of a series of substrates (wafers), the feedforward controller 72 may use the acquired information to adjust implantation parameters in order to achieve a targeted ion dose, such as a matching ion dose between N-type dopants and P-type dopants (dose matching) in the substrates being processed. The adjustment of implantation parameters may be performed in a feedforward manner, where adjustment takes place within-wafer during a series of implantation operations, between wafers, between wafer lots, or at any suitable interval, in accordance with different embodiments.

Said differently, the timing of an adjustment may be done in several different ways, under circumstances where the adjustment involves performing a second adjusted implant procedure to implant a second dopant, based on a first implant operation or procedure used to implant a first dopant. Generally, the first implant procedure may be performed on a given semiconductor substrate, which substrate may be termed a wafer, where the adjusted second implant procedure is done in a feedforward manner on a select wafer. As such, in some embodiments, the given wafer receiving the first implant procedure may be the same as the select wafer receiving the adjusted second implant procedure. Alternatively, the given wafer receiving the first implant procedure may represent a given wafer of a given wafer lot, and the select wafer receiving the adjusted second implant procedure represents an additional wafer of the given wafer lot. Still further, the select wafer receiving the adjusted second implant procedure may represent a given wafer of a subsequent wafer lot. Note that in the cases where the adjusted second implant procedure is derived from a first implant procedure performed in a given wafer, and where the second adjusted implant procedure is performed into a different wafer, the first implant procedure may be maintained for the different wafer. In other words, where the second adjusted implant procedure is used implant a second dopant type into an additional wafer of a given wafer lot, or into a wafer from a subsequent wafer lot, the first implant procedure used to implant the first dopant type into a given wafer may be maintained for implanting the first dopant type into an additional wafer of the same wafer lot or subsequent wafer lot.

By way of explanation, several types of present-day semiconductor devices will benefit from accurate control of dopant concentration within specific device regions of interest. In the cases of power devices, such as metal oxide semiconductor field effect transistors (MOSFETs), double diffused MOSFET (DMOS), insulating gate bipolar transistors (IGBTs), these devices may be formed with a superjunction structure, where current flows vertically through the substrate from source to drain. The overall device structure includes alternating regions of p-type dopant and n-type dopant, that may be in the shape of vertical pillars, where a given p-type pillar is laterally bounded by n-type pillars, and vice versa. In order to fabricate such devices with accurate control of dopant concentration, in the present embodiments, such an alternating pillar structure may be built in a layer-by-layer fashion, where each layer is formed by alternating p-type implantation with n-type implantation into an epitaxially grown semiconductor layer. Table I provides an example of a partial process flow for fabrication of such a structure.

TABLE I 0.5 Ω n-type substrate
11x {
undoped blanket
epi-Si deposition
resist Dep
pPILLAR Litho
p-implant
resist strip
resist Dep
nPILLAR Litho
n-implant
resist strip}
anneal The process flow of Table I illustrates an example where 11 layers are used to build up a superjunction structure that defines an array of pillars of alternating n-type dopant and p-type dopant. Within a given layer, separate n-implantation operations and p-implantation operations are performed. Each p/n implantation operation is associated with a masking operation (resist dep), patterning operations (litho, etch) to define the region to be implanted, and mask removal (resist strip). After the cycle of n-implantation/p-implantation is repeated 11 times, further processing takes place to complete the device structure, including gate formation, source and drain formation (not explicitly shown). The number of cycles may be tailored to be greater or lesser depending upon the device design, while the example of 11 cycles in merely exemplary. To achieve targeted device properties, neutralization of charge carries in the superjunction structure is required. This neutralization relies upon the matching of the p-type concentration to n-type concentration in the alternating regions of the superjunction device, and accordingly relies upon accurate ion dose matching between n-type implantation and p-type implantation.

Figure 3A:
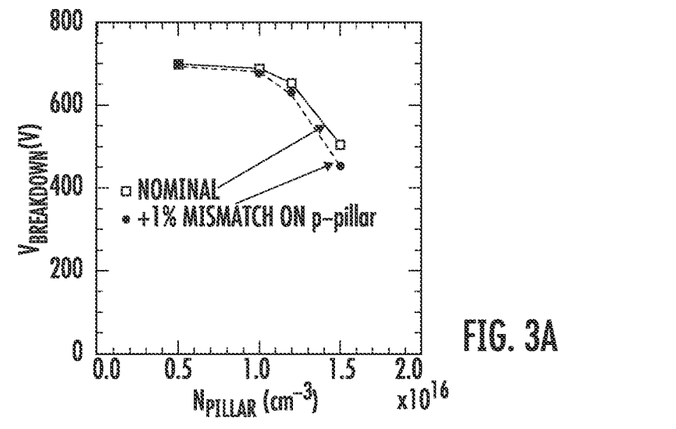
FIG. 3A illustrates simulated breakdown voltage behavior as a function of pillar dopant concentration for a superjunction DMOS device.
Figure 3B:
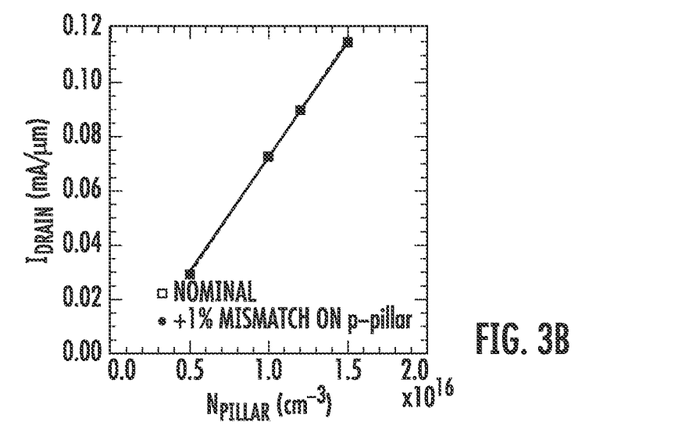
FIG. 3B illustrates simulated ON current behavior as a function of pillar dopant concentration for a superjunction DMOS device.
Figure 3C:
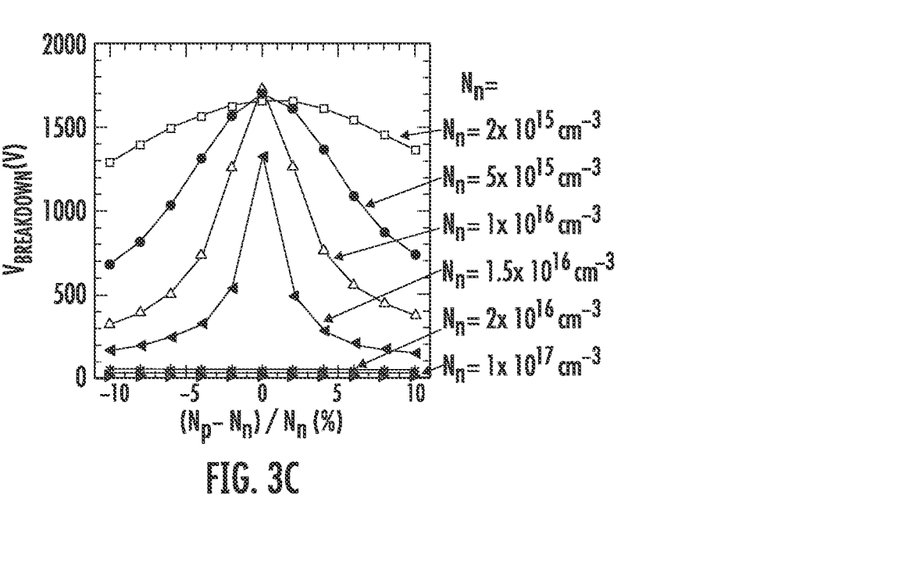
FIG. 3C illustrates simulated breakdown voltage behavior as a function of pillar dopant concentration mismatch for a superjunction DMOS device, shown for several levels of pillar dopant concentration.

FIGS. 3A-3C further define the issues related to dose matching for formation of superjunction devices, in particular, for a superjunction DMOS device. In FIG. 3A, simulation of the device breakdown voltage is shown as a function of pillar dopant concentration (in this case, in the n-type regions). The breakdown voltage remains relatively constant as a function of increasing pillar dopant concentration until a level of 1.2 E16/cm$^3$ is reached, above which level breakdown voltage rapidly declines. In contrast, the drain current increases monotonically and strongly with increasing dopant concentration. Thus, selection of an appropriate dopant concentration may balance the need for high breakdown voltage with the need for high device drain current (ON current). In this example, a dopant concentration of 1.2 E16/cm$^3$ may represent a suitable compromise value, where breakdown voltage is nearly as high as at much lower dopant concentrations, and drain current (nearly 0.1 mA/μm) is at an acceptably high level.

Returning to FIG. 3A, the graph depicts two curves, where the upper curve represents breakdown voltage assuming dopant concentration of p-type pillars is matched to the exact same dopant concentration of n-type pillars, while the lower curve assumes a 1 percent mismatch between n-type pillar dopant concentration and p-type pillar dopant concentration. Note that the breakdown voltage for 1 percent mismatch becomes significantly lower than in the exact matched composition case, when dopant concentration exceeds roughly 1-1.2 E16/cm$^3$. This phenomenon is more expansively illustrated in FIG. 3C, which figure illustrates breakdown voltage behavior as a function of pillar dopant concentration mismatch for a superjunction DMOS device, shown for several levels of pillar dopant concentration. Note that the different curves represent dopant concentration ranging from 2 E15/cm$^3$ to 1 E17/cm$^3$. As also illustrated in FIG. 3A, above a concentration of 1.5 E16/cm$^3$ the breakdown voltage collapses and tends toward extremely low values. As further confirmed in FIG. 3A, for a perfect dopant match (0% mismatch), the breakdown voltage remains constant with increased dopant concentration until a concentration of 1 E16/cm$^3$ is reached. Moreover, referring to FIG. 3C, at the lower absolute dopant concentration levels of 2 E15/cm$^3$ to 5 E15/cm$^3$ the breakdown voltage decreases moderately and in a relatively symmetrical fashion about 0 percent mismatch, with increased dopant mismatch. However, with reference again to FIG. 3B, assuming that relatively device higher drain current is needed, fabrication of devices having absolute dopant concentration in the range of 1.2 E16/cm$^2$ may be needed. In this range of absolute dopant concentration (see curves in FIG. 3C for 1 E16/cm$^2$ and 1.5 E16/cm$^2$) the breakdown voltage is much more sensitive to increases in dopant mismatch. For example, the lower peaked curve in FIG. 3C, representing 1.5 E16/cm$^2$ absolute dopant concentration, exhibits a decrease in breakdown voltage from approximately 1300 V at zero percent dopant mismatch to less than 900 V at just 1 percent dopant mismatch.

From a manufacturing point of review, the above results illustrated in FIGS. 3A-3C illustrate a challenge for dopant concentration control placed upon ion implanters in order to achieve reproducible device properties, and accordingly maintain device yield, or wafer-level yield, at an acceptable level.

Figure 4A:
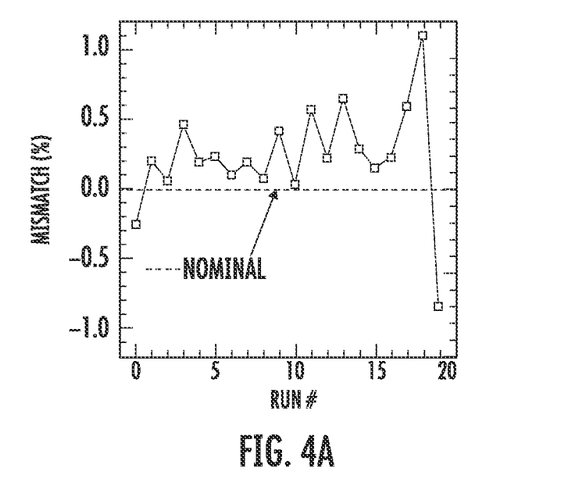
FIG. 4A illustrates simulated run-to-run pillar dopant concentration mismatch in a superjunction device, formed using a reference ion implantation procedure.
Figure 4B:
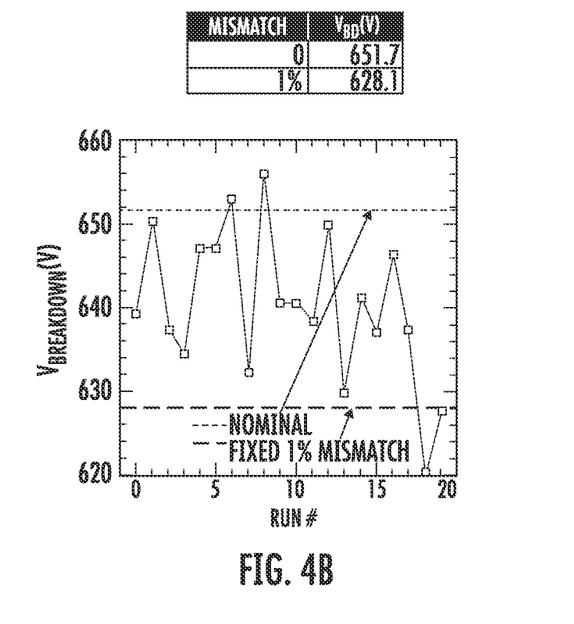
FIG. 4B illustrates simulated run-to-run breakdown voltage behavior corresponding to the data of FIG. 6A.

To highlight this point, FIG. 4A illustrates simulated run-to-run dopant concentration mismatch in a superjunction device, formed using a reference ion implantation procedure. The simulation in the reference ion implantation procedure assumes that the relative dopant concentration mismatch between n-type dopant and p-type dopant can be controlled to a standard deviation (σ) of 1% in a Gaussian random distribution. This level of control approximately corresponds to that level achievable by present day ion implanters. As shown in FIG. 4A, the dopant concentration mismatch percentage will vary randomly from run to run, with a typical amplitude of somewhat less than 0.5%. Turning to FIG. 4B, there is shown a simulated run-to-run breakdown voltage behavior corresponding to the data of FIG. 4A. As shown, the average breakdown voltage decreases below the nominal value (in this example, 651.7 V, the value for perfectly matched n- and p-dopant concentration) by approximately 10 V, while the magnitude of the typical fluctuation in breakdown voltage run-to-run is also on the order of 10 V (for reference, the breakdown voltage value for 1% mismatch, 628.1 V, is also shown). This level of breakdown voltage swing may exceed the acceptable limits for variations in device breakdown voltage, which limits may be in the range of just a few volts or less. Note that the large decrease in breakdown voltage for runs 18 and 19 (FIG. 4B) can be explained by the large average dopant mismatch (FIG. 4A). The differences in breakdown voltage for runs 8 and 10 for nominally low dopant mismatch in each case indicate that presumed differences in vertical distribution of dopants may also play a role in breakdown voltage.

Figure 2:
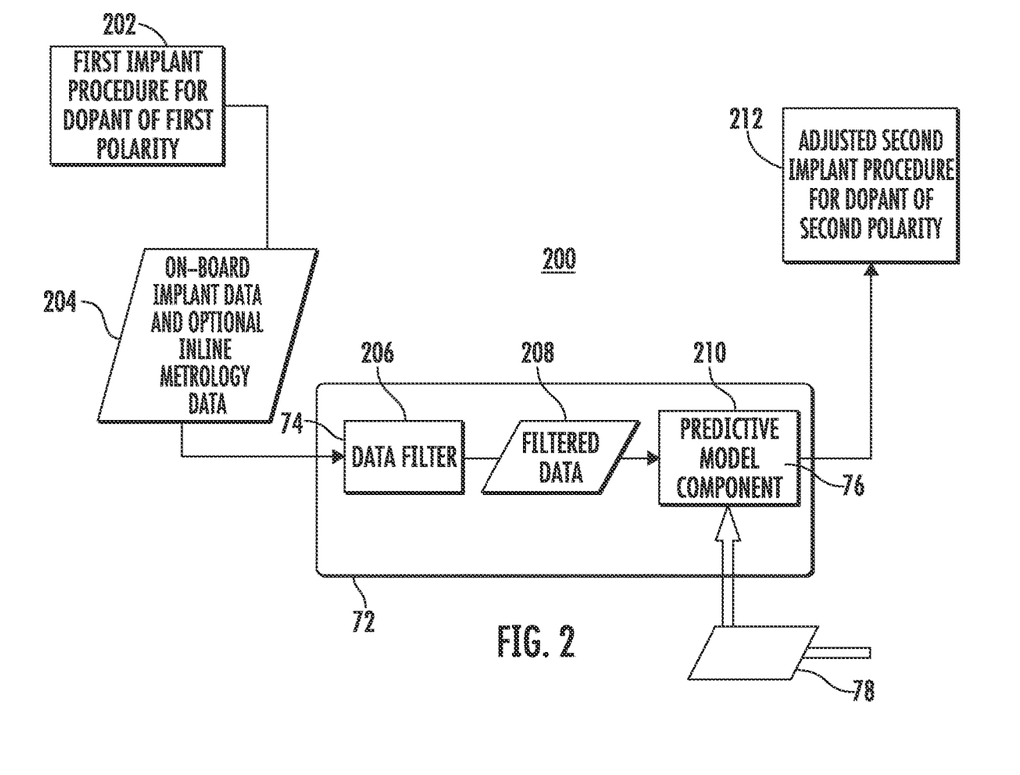
FIG. 2 illustrates components of a feedforward approach for implant dose control according to some embodiments of the disclosure.

In view of the above, the present inventors have developed an ion implantation system and method, based upon a feedforward approach for controlling and adjusting ion dose. This approach may realize much better control of dose matching and accordingly higher device yield. FIG. 2 illustrates components of a feedforward approach for implant dose control according to some embodiments of the disclosure. At the center of the arrangement 200 shown in FIG. 2, is the feedforward controller 72, discussed above. The feedforward controller 72 may include a data filter 74, as well as a predictive model component 76. The feedforward controller 72 may be coupled to receive various inputs, including on-board implant data and optional in-line metrology data 204. Examples of on-board implant data include a dose map, such as a two-dimensional (2-D) dose map that is generated during an ion implantation run, for example, by a current monitor 80, used to measure ion dose, as shown in FIG. 1. Other examples of on-board implant data may include data collected from the result of a Superscan™ ion implantation procedure during an ion implantation run. Other suitable on-board implant metrology data may be collected and fed to the feedforward controller 72.

In addition to on-board implant data, the feedforward controller 72 may be coupled to receive in-line data, meaning data collected from other fabrication tools or measurement tools of a fabricator including the system 10, used to process the substrates in question. Examples of in-line data include measurement data related to substrate electrical properties, dopant concentration, and so forth, including non-destructive metrology methods.

In the scenario of FIG. 2, the feedforward controller 72 may use data collected as the result of a first implant procedure 202 for dopant of a first polarity, such as for implanting p-type dopant, as well as any suitable in-line data, discussed above, in order to correct ion implantation procedures to be performed for introducing dopant of a second polarity into a substrate or group of substrates. The latter is shown as the adjusted second implant procedure 212 for a dopant of the second polarity, such as an n-type dopant.

In particular, the on-board implant data as well as optional in-line data may be received through the data filter 206 of the feedforward controller 72. The data filter 206 may be set to receive a set of on-board implant data and to filter out outlier data in order to narrow down data to be processed at the predictive model component 210. Thus, a set of filtered data 208, based upon the received on-board implant data, and optional in-line data, may be transmitted from the data filter to the predictive model component 210 for processing. The predictive model component 210 may employ a set of procedures or algorithms (a predictive model) to output implant information for specifying the adjusted second implant procedure 212, including adjusting values of implantation parameters for performing the adjusted implant procedure. In particular, the adjustment may result in correcting the implant dose to be performed for the dopant of the second type, based upon the data received by the predictive model component 210. In some examples, the predictive model employed by the predictive model component 210 may be developed in advance of implantation procedures, based on offline data (e.g., factory data), generally shown as data 78. Moreover, the predictive model may relate the nominal ion dose for a given implantation procedure to the actual ion dose or a measured device characteristic (e.g., breakdown voltage).

Figure 2B:
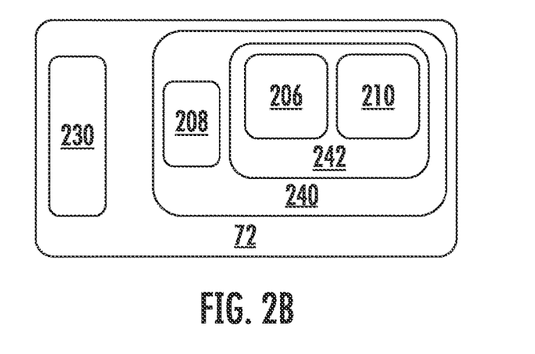
FIG. 2B illustrates components of a feedforward controller according to some embodiments of the disclosure.

According to some embodiments of the disclosure, the predictive model component 210, as well as the data filter 206 may include logic to determine the proper ion dose or related parameters for performing an adjusted second implant procedure based upon a first implant procedure. In some instances, the logic of predictive model component 210 and data filter 206 may be implemented in a combination of software and hardware, or firmware. Turning to FIG. 2B there is shown a block diagram of feedforward controller 72, including electronic processing circuitry, shown as processor 230, and a memory 240, which memory may be implemented as a non-transitory computer-readable storage medium. As shown, the memory 240 may include data filter 206, as well as the predictive model component 210, and may additionally store the filtered data 208. In some examples, the data filter 206 and predictive model component may constitute part of a dose-matching routine 242 that is stored in the memory 240. As such, the predictive model component 210 as well as data filter 206 may be implemented in a suitable computer-readable storage medium as instructions in memory 240. These instructions, in turn, when executed by a computer, such as a processor in the computer, will cause the computer to perform the various operations as detailed herein. These operations that constitute a dose-matching routine may be used in order determine proper adjustments to ion implantation to implement an adjusted second implant procedure for a dopant of a second type that dose matches to that dose generated in a first implant procedure for a dopant of a first type.

Figure 5A:
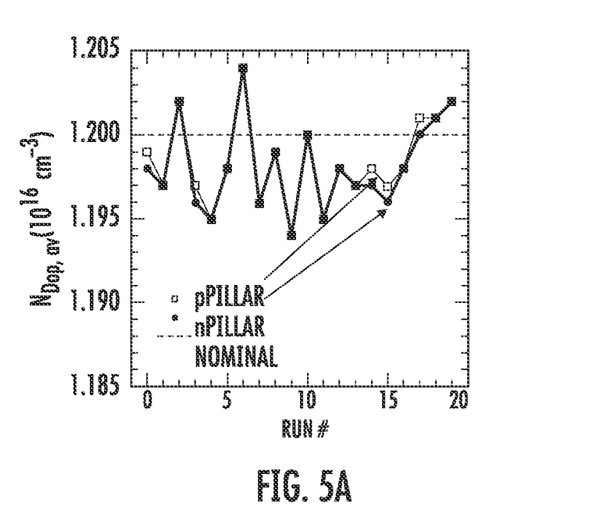
FIG. 5A illustrates simulated run-to-run breakdown pillar dopant concentration for a superjunction device fabricated using a feedforward controller according to embodiments of the disclosure.

FIG. 5A illustrates simulated run-to-run dopant concentration behavior for a superjunction device fabricated using a feedforward controller according to embodiments of the disclosure. In this example, a series of runs are performed where feedforward control, as detailed above, is used to adjust $n^+$ implantation according to $p^+$ implantation data that is received by the feedforward controller. In FIG. 5A, both n-type dopant and p-type dopant concentration curves are shown. This approach results in more precise control of dopant matching between n-type dopant and p-type dopants, and therefore a more precise control on breakdown voltage over a series of 20 runs. Note that in the simulation of FIG. 5A, for implant dose, a Gaussian distribution with random normal deviates where $\sigma$ equals 1% is assumed. Under this assumption the absolute dopant concentration varies in the simulation of FIG. 5A by somewhat less than 0.5% run-to-run. Note that with the use of a feedforward controller the matching of p-dopant concentration to n-dopant concentration in each run is much better than the random fluctuation in total dopant concentration. Even though the variation in absolute dopant concentration is much higher, this matching is on the order of 0.1%.

Figure 5B:
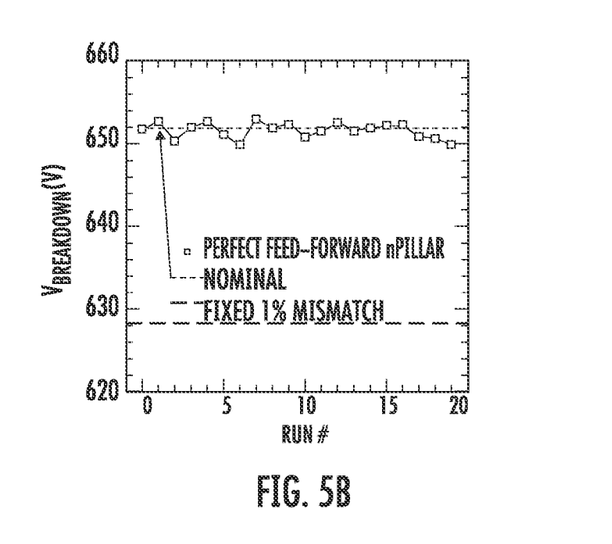
FIG. 5B illustrates simulated run-to-run breakdown voltage behavior corresponding to the data of FIG. 5A.

FIG. 5B illustrates simulated run-to-run breakdown voltage behavior corresponding to the data of FIG. 5A. In this simulation, the nominal breakdown voltage is shown, as well as the value of breakdown voltage if a non-varying 1% dopant mismatch were present in all runs. As shown, with the use of a feedforward controller, the breakdown voltage fluctuation run-to-run is much less than the corresponding data of FIG. 4B, without feedforward controller, where the same Gaussian distribution with random normal deviates where σ equals 1% is assumed for implant dose control.

Figure 6:
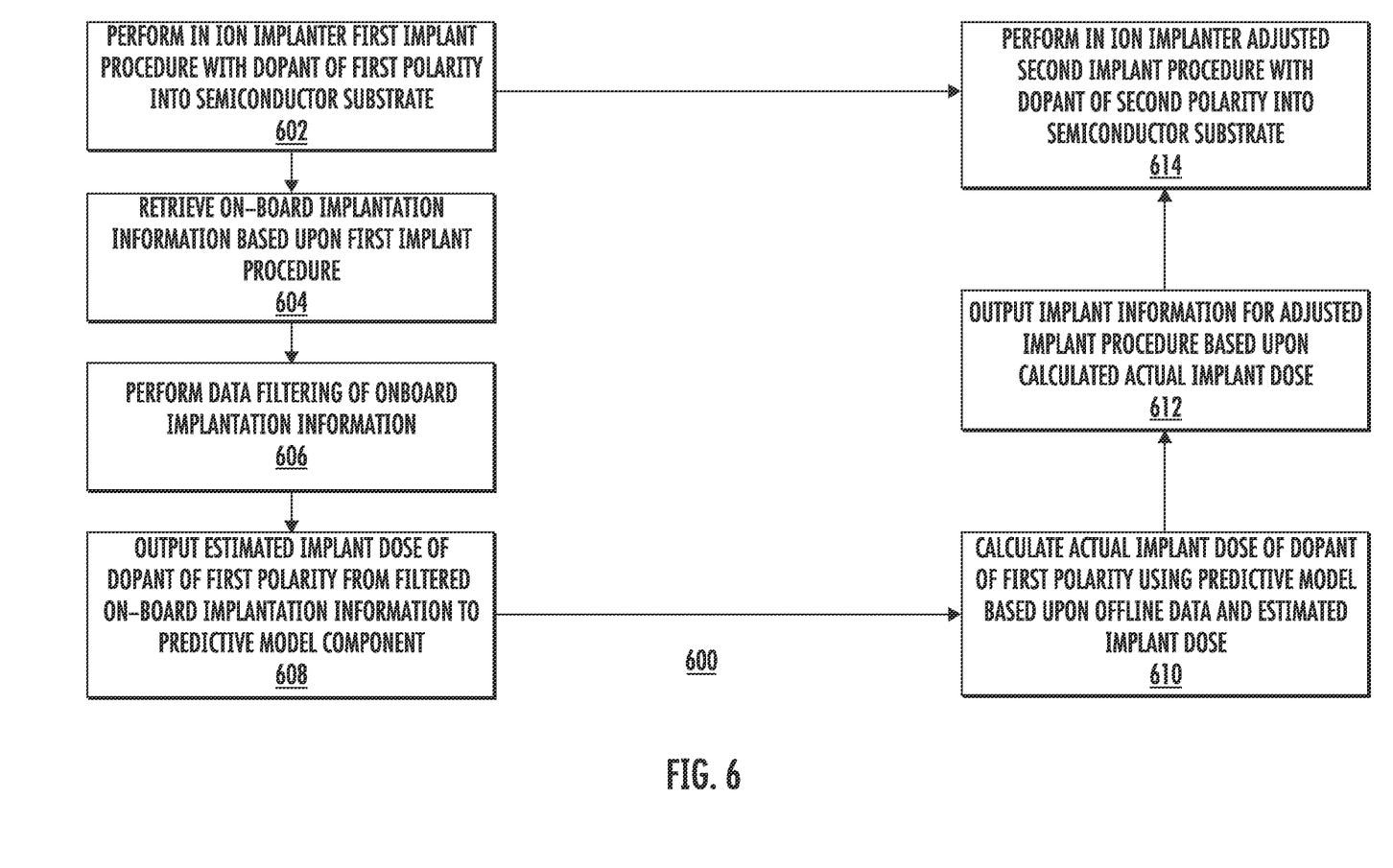
FIG. 6 illustrates an exemplary process flow.

In practical terms, the results of FIGS. 4A-5B demonstrate that feedforward control may have a dramatic effect on improving yield. For example, where the target for breakdown voltage control is that σ equal 0.2%, nearly all of the data of FIG. 5B may meet this criterion, while nearly all of the data of FIG. 4B do not meet this criterion. FIG. 6 depicts an exemplary process flow, show as process flow 600. At block 602, a first implant procedure into a semiconductor substrate is performed in an ion implanter using a dopant of a first polarity. For purposes of explanation, the dopant of the first polarity may be assumed to be a p-type dopant.

At block 604, on-board implantation information is retrieved based upon the first implant procedure. The on-board implant data may include a dose map, generated during an ion implantation run, data collected from the result of a Superscan™ ion implantation procedure during an ion implantation run, or other suitable on-board implant metrology data collected during an ion implantation run.

At block 606, data filtering is performed on the on-board implantation information, to reduce data size by filtering out certain data, such as outlier data.

At block 608, an estimated implant dose for the dopant of the first polarity is output to a predictive model component. The estimated implant dose may be based on on-board implantation information after data filtering of block 606.

At block 610, an actual implant dose of the dopant of the first polarity is calculated corresponding to the first implant procedure, such as an actual p-type dopant ion dose. The actual implant dose may be calculated using a predictive model, and based upon offline data and the estimated implant dose from block 608. Examples of offline data include, e.g., factory data.

At block 612, implant information is output in order to perform an adjusted implant procedure based upon the calculated implant dose of block 610. The implant information may be output to a controller, in one example, to automatically adjust a second implant procedure to follow.

At block 614, an adjusted second implant procedure is performed in the ion to implant a dopant of a second polarity into the semiconductor substrate, such as an n-type dopant. The adjusted second implant procedure may include control signals for the appropriate beamline components to adjust the total ion dose of the dopant of the second type that is to be implanted into the substrate, in accordance with the receive implant information.

Figure 7:
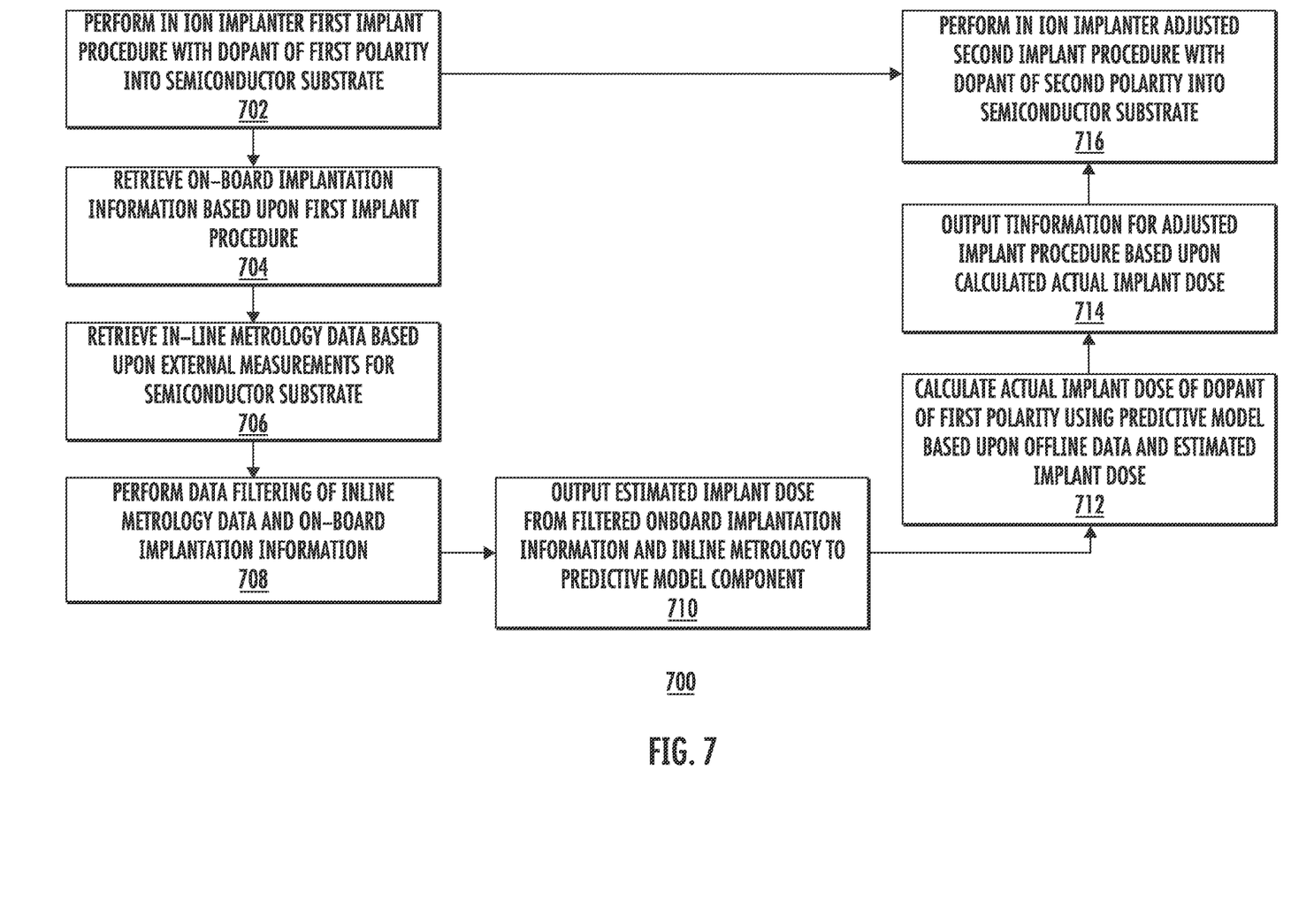
FIG. 7 illustrates another exemplary process flow.

FIG. 7 depicts another exemplary process flow, show as process flow 700. At block 702, a first implant procedure into a semiconductor substrate is performed in an ion implanter using a dopant of a first polarity. For purposes of explanation, the dopant of the first polarity may be assumed to be a p-type dopant.

At block 704, on-board implantation information is retrieved based upon the first implant procedure. The on-board implant data may include a dose map, generated during an ion implantation run, data collected from the result of a Superscan™ ion implantation procedure during an ion implantation run, or other suitable on-board implant metrology data collected during an ion implantation run.

At block 706, in-line metrology data based upon external measurements for the semiconductor substrate is retrieved. Examples of in-line metrology data include data collected from other fabrication tools or measurement tools of a fabricator used to process the substrates in question. Examples of in-line data are measurement data used to measure substrate electrical properties, dopant concentration, and so forth.

At block 708, data filtering of the in-line metrology data and the on-board implantation information is performed, generally as described previously.

At block 710 an estimated implant dose is output to a predictive model component. The estimated implant dose output may be determined based upon the filtered on-board implantation information and filtered in-line metrology.

At block 712 an actual implant dose of the dopant of the first polarity is calculated corresponding to the first implant procedure, such as an actual p-type dopant ion dose. The actual implant dose may be calculated using a predictive model, and based upon offline data and the estimated implant dose from block 710. Examples of offline data include, e.g., factory data.

At block 714, information in output to perform an adjusted implant procedure based upon the calculated actual implant dose.

At block 716, an adjusted second implant procedure is performed in the ion to implant a dopant of a second polarity into the semiconductor substrate, such as an n-type dopant. The adjusted second implant procedure may include control signals for the appropriate beamline components to adjust the total ion dose of the dopant of the second type that is to be implanted into the substrate, according to the calculated actual ion dose for the dopant of the first type.

The present embodiments provide at least the following advantages. As a first advantage, the feedforward control approach of the present embodiments, allows corrective action to adjust ion implantation parameters to be taken before a given implant process is out of control. As a second advantage, the feedforward control approach, when deploying a combination of statistical offline data and in-line data to estimate actual implant dose, provides a more accurate approach to dose match, and thus more accurately control device properties in relevant devices that rely on precise dose matching.

The present disclosure is not to be limited in scope by the specific embodiments described herein. Indeed, other various embodiments and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose, yet those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

The invention claimed is:

1. A method of operating a beamline ion implanter, comprising:

performing, in the beamline ion implanter, a first implant procedure to implant a dopant of a first polarity into a given semiconductor substrate;

generating an estimated implant dose of the dopant of the first polarity based upon a set of filtered information, generated by the first implant procedure;

calculating an actual implant dose of the dopant of the first polarity using a predictive model based upon the estimated implant dose; and performing, in the beamline ion implanter, an adjusted second implant procedure to implant a dopant of a second polarity into a select semiconductor substrate, based upon the actual implant dose, wherein the set of filtered information comprises filtered on-board implantation information, collected from metrology performed on the substrate in the beamline ion implanter, and further comprises in-line data, collected from other fabrication tools or measurement tools of a fabricator used to process the given substrate.

2. The method of claim 1, wherein the filtered on-board implantation information is derived from a two-dimensional dose map, generated by a current monitor for measuring ion dose during the first implant procedure.

3. The method of claim 1, wherein the predictive model is based upon factory-generated data.

4. The method of claim 1, wherein the predictive model relates a nominal ion dose for the first implant procedure to a measured device characteristic of the given semiconductor substrate.

5. The method of claim 4, wherein the measured device characteristic comprises a breakdown voltage.

6. The method of claim 1, wherein the given semiconductor substrate and the select semiconductor substrate are the same.

7. The method of claim 1, wherein the given semiconductor substrate is a first semiconductor substrate of a given wafer lot, and the select semiconductor substrate is an additional wafer of the given wafer lot, or is a given wafer of a subsequent wafer lot, and wherein the first implant procedure and the adjusted second implant procedure are performed in the additional wafer of the given wafer lot, or are performed in the given wafer of the subsequent wafer lot.

8. The method of claim 1, wherein the first implant procedure generates a first dopant concentration of the dopant of the first polarity, and wherein the adjusted second implant procedure provides a second dopant concentration of the dopant of the second polarity, the second dopant concentration matching the first dopant concentration of the dopant of the first polarity.

9. The method of claim 1, wherein the first implant procedure and the adjusted second implant procedure are performed to build a superjunction structure, the superjunction structure comprising an array of p-type pillars, bounded by an array of n-type pillars.

10. The method of claim 9, wherein the superjunction structure comprises a plurality of layers, wherein each layer is formed by performing the first implant procedure and the adjusted second implant procedure.

11. A non-transitory computer-readable storage medium, the non-transitory computer-readable storage medium including instructions that when executed by a computer, cause the computer to:

generate a set of filtered data, based upon on-board implant data, derived from a first implant procedure of a dopant of a first polarity, performed in an ion implanter on a given semiconductor substrate, and in-line data, collected from fabrication tools, external to the ion implanter;

generate an estimated implant dose of the dopant of the first polarity based upon the set of filtered data;

calculate an actual implant dose of the dopant of the first polarity based upon the estimated implant dose; and send instructions to implement an adjusted second implant procedure to implant a dopant of a second polarity into a select semiconductor substrate, based upon the actual implant dose.

12. The non-transitory computer-readable storage medium of claim 11, wherein the set of filtered data is based upon a set of filtered on-board implantation information, collected from metrology performed on the given semiconductor substrate in the ion implanter.

13. The non-transitory computer-readable storage medium of claim 12, wherein the set of filtered on-board implantation information is derived from a two-dimensional dose map, generated by a current monitor for measuring ion dose during the first implant procedure.

14. The non-transitory computer-readable storage medium of claim 11, wherein the instructions further configure the computer to calculate the actual implant dose based upon factory-generated data.

15. The non-transitory computer-readable storage medium of claim 11, wherein the instructions further configure the computer to calculate the actual implant dose by relating a nominal ion dose for the first implant procedure to a measured device characteristic of the given semiconductor substrate.

16. The non-transitory computer-readable storage medium of claim 15, wherein the measured device characteristic comprises a breakdown voltage.

17. An ion implanter, comprising:

an ion source to generate an ion beam;

a set of beamline components to implant the ion beam into a given substrate;

a current monitor to measure an implant dose of the ion beam in the given substrate; and a feedforward controller, comprising a memory and a processor, the feedforward controller comprising a dose-matching routine operable on the processor to:

generate a set of filtered data, based upon on-board implant data, derived from a first implant procedure for a dopant of a first polarity, performed in the ion implanter on the given substrate, and in-line data, collected from fabrication tools, external to the ion implanter;

generate an estimated implant dose of the dopant of the first polarity based upon the set of filtered data;

calculate an actual implant dose of the dopant of the first polarity based upon the estimated implant dose; and send instructions to implement an adjusted second implant procedure to implant a dopant of a second polarity into a select semiconductor substrate, based upon the actual implant dose.

* * * * *